US012812828B2

(12) United States Patent
Chen et al.

(10) Patent No.: US 12,812,828 B2
(45) Date of Patent: Nov. 24, 2026

(54) APPARATUS FOR PROVIDING AN ELECTRONIC UNIT WITH A WATER SEAL, EMI SHIELD, AND EMI CONTACTS

(71) Applicant: Harman International Industries, Incorporated, Stamford, CT (US)

(72) Inventors: Jianing Chen, Northville, MI (US); David Jia, Canton, MI (US); Zhiming Huang, Shanghai (CN); Justin Berg, Livonia, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 134 days.

(21) Appl. No.: 18/592,255

(22) Filed: Feb. 29, 2024

(65) Prior Publication Data

US 2025/0280520 A1 Sep. 4, 2025

(51) Int. Cl.
*H05K 9/00* (2006.01)
*H05K 5/00* (2025.01)
*H05K 5/06* (2006.01)

(52) U.S. Cl.
CPC ......... *H05K 9/0015* (2013.01); *H05K 5/0056* (2013.01); *H05K 5/0069* (2013.01); *H05K 5/061* (2013.01)

(58) Field of Classification Search
CPC .. H05K 9/0015; H05K 5/0056; H05K 5/0069; H05K 5/061
See application file for complete search history.

(56) References Cited

U.S. PATENT DOCUMENTS

| | | | | |
|---|---|---|---|---|
| 5,550,713 A * | 8/1996 | Pressler | H05K 9/0037 | 174/371 |
| 6,219,258 B1 * | 4/2001 | Denzene | H05K 5/061 | 361/752 |
| 6,624,432 B1 * | 9/2003 | Gabower | H05K 9/0039 | 250/517.1 |
| 7,262,369 B1 * | 8/2007 | English | H05K 7/20445 | 174/370 |
| 10,299,416 B2 * | 5/2019 | Vehkapera | H05K 1/0216 | |
| 2009/0207579 A1 * | 8/2009 | Boetto | H05K 9/0016 | 361/818 |
| 2014/0266903 A1 * | 9/2014 | Ding | G01S 13/931 | 361/728 |

(Continued)

*Primary Examiner* — David D Davis
(74) *Attorney, Agent, or Firm* — Brooks Kushman P.C.

(57) ABSTRACT

An apparatus comprising an electronic unit is provided. The electronic unit may include a housing having a cover and a base that define an opening for receiving a printed circuit board, and a plurality of electronics positioned thereon that may generate electromagnetic interference (EMI) and be susceptible to water damage. A first gasket dispensed onto the cover is configured to at least partially remove electromagnetic interference generated from the plurality of electronics and to prevent liquid from entering into the opening of the housing. A second gasket dispensed onto the base is configured to prevent liquid from penetrating into the opening of the housing. A connector support fitted between the cover and the base may include a first rib that presses into the second gasket to prevent liquid from penetrating into the housing, and a second rib that bites into the base of the housing to provide EMI contact.

15 Claims, 7 Drawing Sheets

(56) References Cited

U.S. PATENT DOCUMENTS

| | | | | |
|---|---|---|---|---|
| 2014/0268583 | A1* | 9/2014 | Ding | H05K 9/0016 361/728 |
| 2020/0221600 | A1* | 7/2020 | Chou | H05K 5/0217 |
| 2021/0153340 | A1* | 5/2021 | Lee | G06F 1/182 |
| 2022/0354011 | A1* | 11/2022 | Hadwan | H05K 5/069 |
| 2023/0101552 | A1* | 3/2023 | Duralek | H05K 5/006 174/377 |
| 2024/0284588 | A1* | 8/2024 | Tzinares | H05K 9/0039 |
| 2025/0280520 | A1* | 9/2025 | Chen | H05K 9/0015 |

* cited by examiner

APPARATUS FOR PROVIDING AN ELECTRONIC UNIT WITH A WATER SEAL, EMI SHIELD, AND EMI CONTACTS

TECHNICAL FIELD

Aspects disclosed herein generally relate to electronic units with a housing for use in establishing a fluid seal, an electromagnetic interference (EMI) shield, and EMI contacts for electronic units. These aspects and others will be discussed in more detail below.

BACKGROUND

Vehicle electronics have steadily increased in complexity since the introduction of engine control units in the early 1970s. With that, comes a desire for finding innovative ways to house electronic units installed in vehicles, for example, so as to protect and enhance the overall function of a unit.

SUMMARY

In at least one aspect, an electronic unit is provided. The electronic unit may comprise a printed circuit board (PCB); a plurality of electronics positioned on the PCB; a housing including a cover and a base that define an opening for receiving the PCB and the plurality of electronics; and a first gasket encircling an outer periphery of the PCB and being configured to at least partially remove electromagnetic interference generated from the plurality of electronics and to prevent liquid from exterior of the housing from penetrating into the opening of the housing.

In another aspect, an electronic unit is provided. The electronic unit may comprise a printed circuit board (PCB); a plurality of electronics positioned on the PCB; a housing including a cover and a base that define an opening for receiving the PCB and the plurality of electronics; and a first gasket positioned on an outer periphery of the PCB and being configured to at least partially remove electromagnetic interference generated from the plurality of electronics and to prevent liquid from exterior of the housing from penetrating into the opening of the housing.

In yet another aspect, an electronic unit is provided. The electronic unit may comprise a printed circuit board (PCB); a plurality of electronics positioned on the PCB; a housing including a cover and a base that define an opening for receiving the PCB and the plurality of electronics; and a connector support to receive a plurality of connectors. The connector support may be positioned between the cover and the base and may further be positioned on a side of the housing. The cover of the housing may include a first gasket positioned on an outer periphery of the PCB. The gasket may be configured to at least partially remove electromagnetic interference generated from the plurality of electronics and to prevent liquid from exterior of the housing from penetrating into the opening of the housing. The base of the housing may include a second gasket positioned on an outer perimeter of the base on the side of the housing. The second gasket may be configured to prevent liquid from exterior of the housing from penetrating into the opening of the housing.

DETAILED DESCRIPTION

Figure 1:
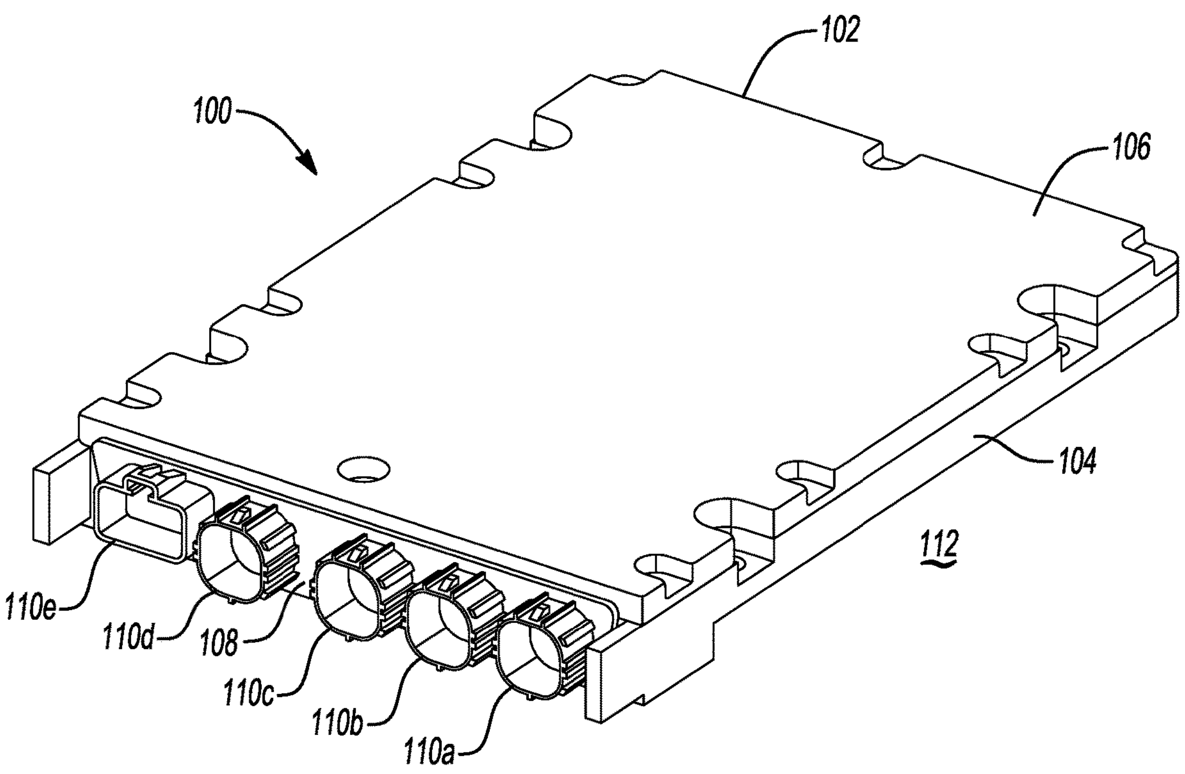
FIG. 1 illustrates an electronic unit including a housing in accordance with an embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Provided herein is an electronic unit including a housing for providing a water seal, an EMI shield, and EMI contact in a single part. The electronic unit may be a controller. Commonly, a water seal for connectors is achieved by providing an individual water seal around each connector. This approach, however, does not provide enough of a water seal. Often seals of this nature fail to pass an IPX8 test due to a tolerance stack up around each connector. Additionally, this approach does not provide enough of the EMI shield and the EMI contact (i.e., grounding) for connectors. Using this approach, a separate EMI shield may be needed for the connectors.

The electronic units provided herein in accordance with at least some embodiments may include a housing that combines a water seal that passes IPX8 standards (e.g., water immersion tests) for water resistance, an EMI shield, and EMI contact in one single part. Housings disclosed in some embodiments may eliminate the tolerance issue that occurs when individual water seals are provided around each connector, provide the robust EMI shield and the EMI contact (e.g., grounding) for connectors, and achieve an IPX8 rating.

In general, the disclosed housing may be utilized in connection with any electronic unit that requires a water seal (including an IPX8 waterproof rating), a robust EMI shield and an EMI contact for connectors. In an example, the disclosed housing may be utilized in connection with electronics units in an automotive vehicle. Non-limiting examples of the vehicle electronic units (or central control units) may include but not limited to, infotainment head units, instrument panel modules (or instrument panel control units), navigation modules (or navigation control units), audio control units, on-board charging devices, etc.

IPX8 testing is used to determine the ability of an electronic unit or enclosure to withstand fluid (e.g., water) submersion for extended periods of time. The test standard describing the details of IPX8 testing is IEC 60529. In one example, to achieve an IPX8 waterproof rating, an electronic unit or enclosure is required to remain submerged in, for example, 1 meter of water for up to 30 minutes without leakage or malfunction. The housing disclosed herein may meet IPX8 waterproofing standards.

While EMI shielding may be achieved by utilizing any number of electrical/electronic mechanisms to alter the frequency, such mechanisms may be costly and less robust. The mechanical shielding offered by the housing provided herein may reduce the emittance of EMI and electronic noise in a more robust and cost-effective manner.

FIG. 1 illustrates a top view of an electronic unit 100 in accordance with one embodiment as will be further described herein. The electronic unit 100 may include at least one controller (not shown) that is positioned on the PCB 112 and may be part of the electronics 113. The controller may be configured to control any number of operations in a vehicle. The electronic unit 100 generally includes a housing 102. In one example, the housing 102 may undergo die casting and be formed of metal. Further, the housing 102 may be formed of various non-ferrous metals such as, but not limited to, zinc, copper, aluminum, magnesium, lead, pewter, tin-based alloys, etc. The housing 102 may alternatively be formed of ferrous metals or plastics. The housing 102 may include a base 104, and a cover 106 sized to be fitted over the base 104. The housing 102 may further include a connector support 108 sized to fit at least one connector 110*a*, 110*b*, 110*c*, 110*d*, 110*e* ("110"). The electronic unit 100 may further include a printed circuit board 112 (see FIG. 2) including a plurality of electronics 113 positioned thereon. The PCB 112 along with the plurality of electronics 113 are positioned within an opening 105 of the housing 102. The plurality of electronics 113 of the electronic unit 100 are susceptible to generating electromagnetic interference (EMI) and noise.

Figure 2:
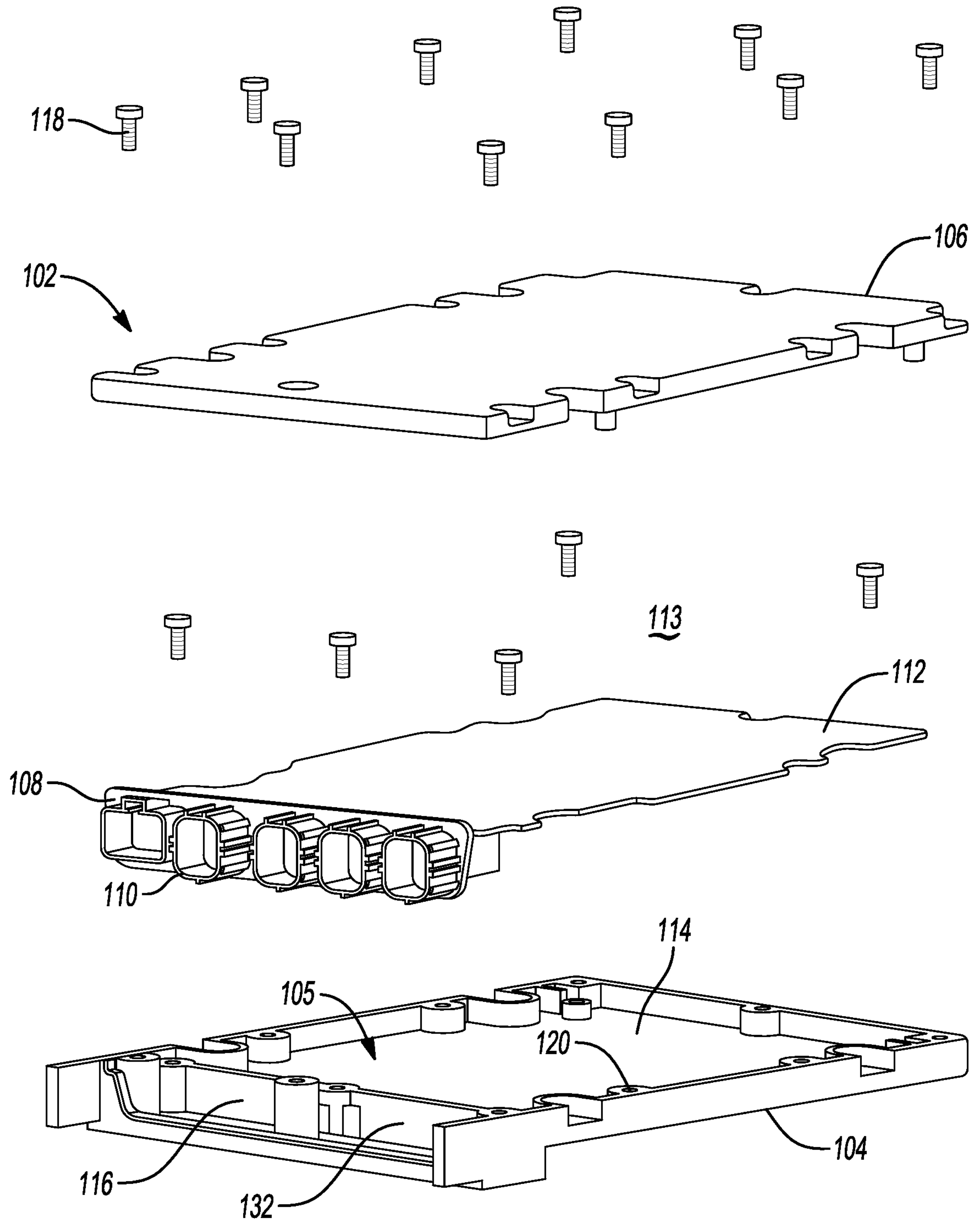
FIG. 2 illustrates an exploded view of the electronic unit of FIG. 1 in accordance with an embodiment.

FIG. 2 illustrates an exploded view of an electronic unit 100 including the housing 102 in accordance with an embodiment. As shown, the housing 102 may be formed as multiple parts including the base 104, the cover 106, and the connector support 108. In one example, the PCB 112 including the electronics 113 may be secured to the connector support 108. The PCB 112 may be sized to be fitted into a first recess 114 in the base 104 of the housing 102. The connector support 108 may be sized to be fitted into a second recess 116 in the base 104 of the housing 102. A wall (or divider) 132 separates the first recess 114 from the second recess 116. The electronic unit 100 may be assembled by fitting the connector support 108 into the second recess 116 of the base 104 and the PCB 112 into the first recess 114 of the base 104 and securing the connector support 108 and the PCB 112 to the base 104 with fasteners 118. In one example, the fasteners 118 may be screws. The cover 106 may be positioned over the base 104. The cover 106 may be attached to the base 104 using the fasteners 118. It is recognized that the cover 106 and the base 104 may have apertures 120 through which the fasteners may be inserted. It is also recognized that the cover 106 may be secured to the base 104 via any number of male-female interfaces or configurations. It is also further recognized that the PCB 112 may also have apertures 121 through which the fasteners may be inserted. Alternatively, the fasteners 118 may be drilled or pressed through the PCB 112 to secure the PCB 112 to the base 104 of the housing 102.

Figure 3:
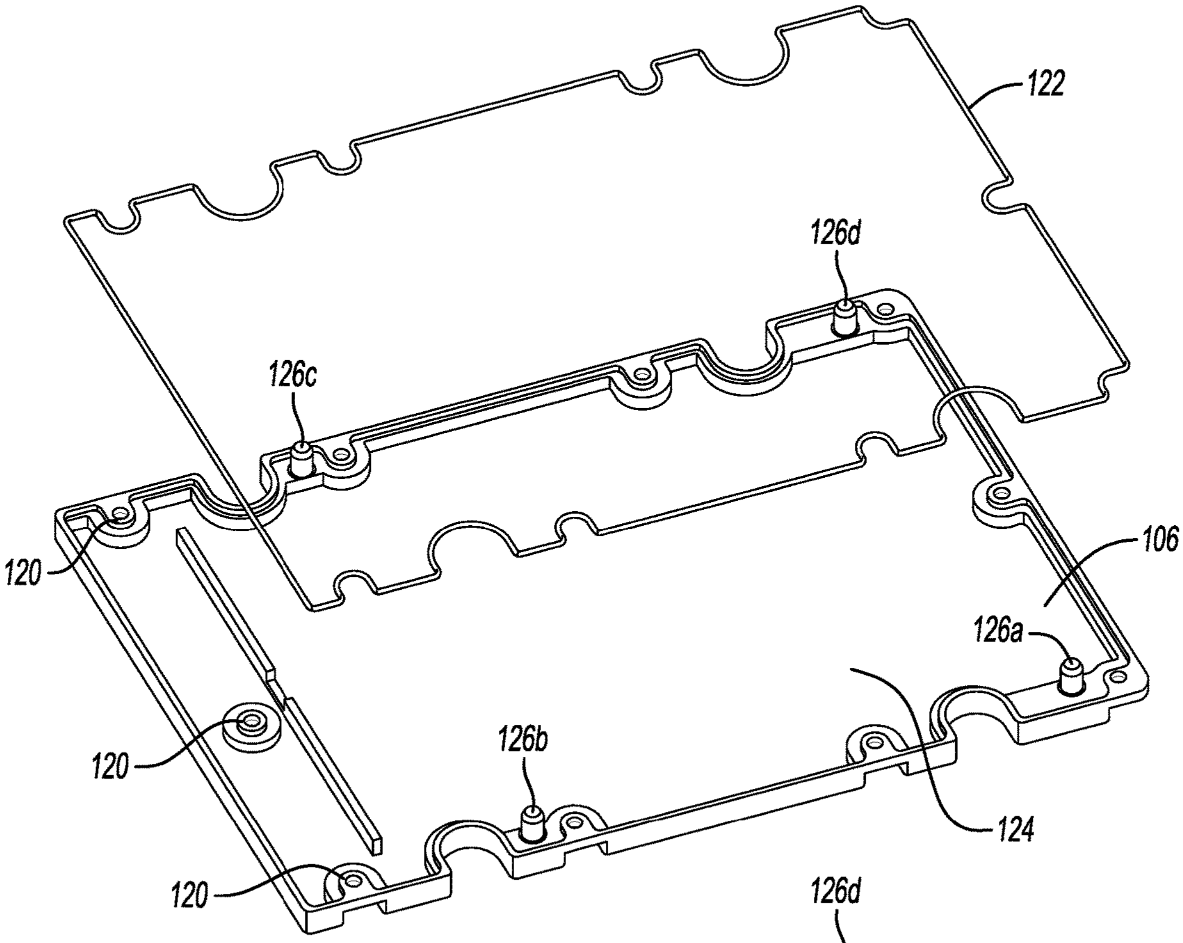
FIG. 3 illustrates a cover and a corresponding electromagnetic compatibility (EMC) gasket in accordance with an embodiment.

FIG. 3 illustrates an exploded view of the cover 106 of the housing 102 and a first gasket 122. The first gasket 122 may be an electromagnetic compatibility gasket (EMC gasket). The first gasket 122 may aid in mitigating EMI that may be generated by the plurality of electronics 113 and also aid in preventing water from intruding into housing 102. The first gasket 122 may also reduce pressure or tension on the PCB 112 when the fasteners 118 are attached to the cover 106 to secure the cover 106 to the base 104. The first gasket 122 may be fitted along an interior of the perimeter of the cover 106. In an example, the first gasket 122 may be dispensed onto a bottom surface 124 of the cover 106 and cured in place. In an example, the first gasket 122 may be dispensed onto the cover by a computer numerical control (CNC) machine. It is recognized that other methods for dispensing the first gasket 122 onto the cover may be used as well. In an example, the first gasket 122 may be formed from a rubber or a silicone dispensable material. In an example, the first gasket 122 may be formed from a rubber or silicone dispensable material that also includes metal to promote metal to metal contact between the base 104 of the housing 102 and the cover 106 of the housing 102. Alternatively, the rubber or silicone gasket may be mixed with a metal powder. The metal powder in the first gasket 122 may provide electric current grounding for the base 104 and the cover 106. In addition to being dispensed along the perimeter of the bottom surface 124 of the cover 106, the first gasket 122 may be dispensed along the perimeter of each of the apertures 120 through which the fasteners 118 may be inserted. In this way, the first gasket 122 may provide a water seal around the area surrounding the fasteners 118 to prevent water (liquid) from intruding therethrough. The cover 106 may further include guide pins 126*a*, 126*b*, 126*c*, and 126*d* ("126"). The guide pins 126 may project outwardly from the bottom surface 124 of the cover 106 to aid in aligning the cover 106 with the base 104 during the assembly of the housing 102.

Figure 4:
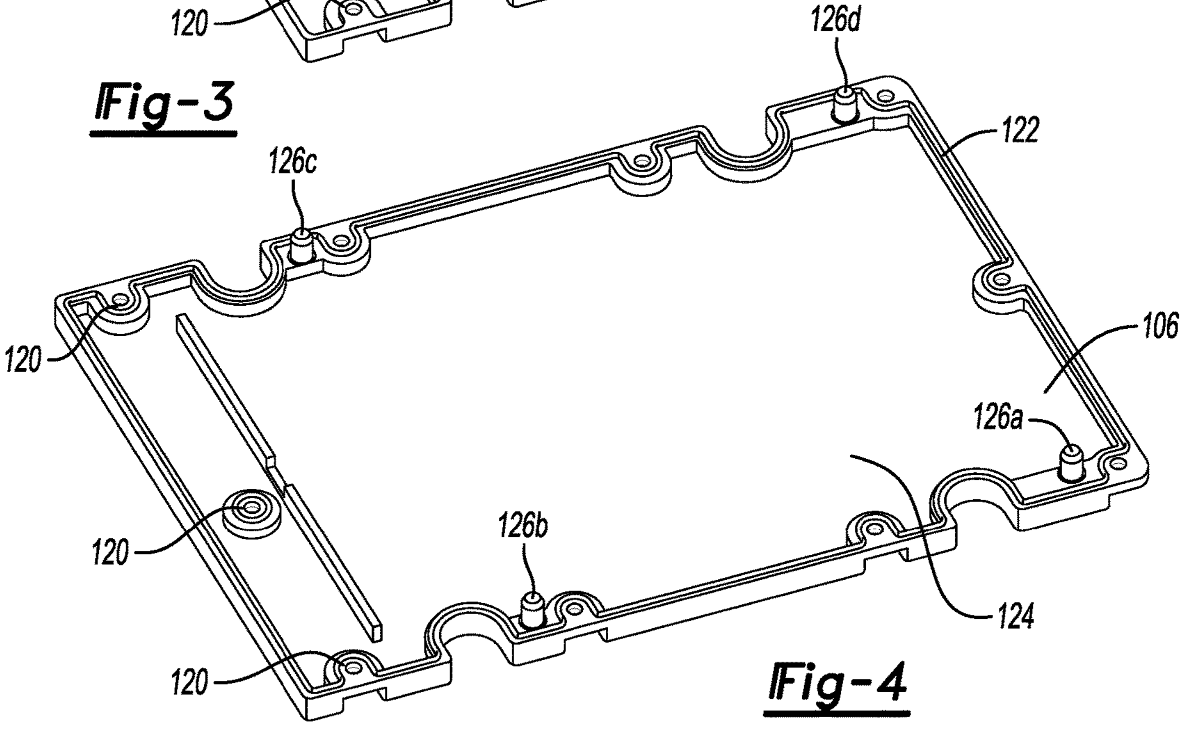
FIG. 4 illustrates the EMC gasket dispensed onto the housing cover in accordance with an embodiment.

FIG. 4 illustrates the first gasket 122 being dispensed onto the cover 106 of the housing 102 in accordance with an embodiment. The first gasket 122 is dispensed onto the bottom surface 124 of the cover 106 and is dispensed along the perimeter of the cover 106 and along the perimeter of the apertures 120 through which the fasteners 118 may be inserted.

Figure 5:
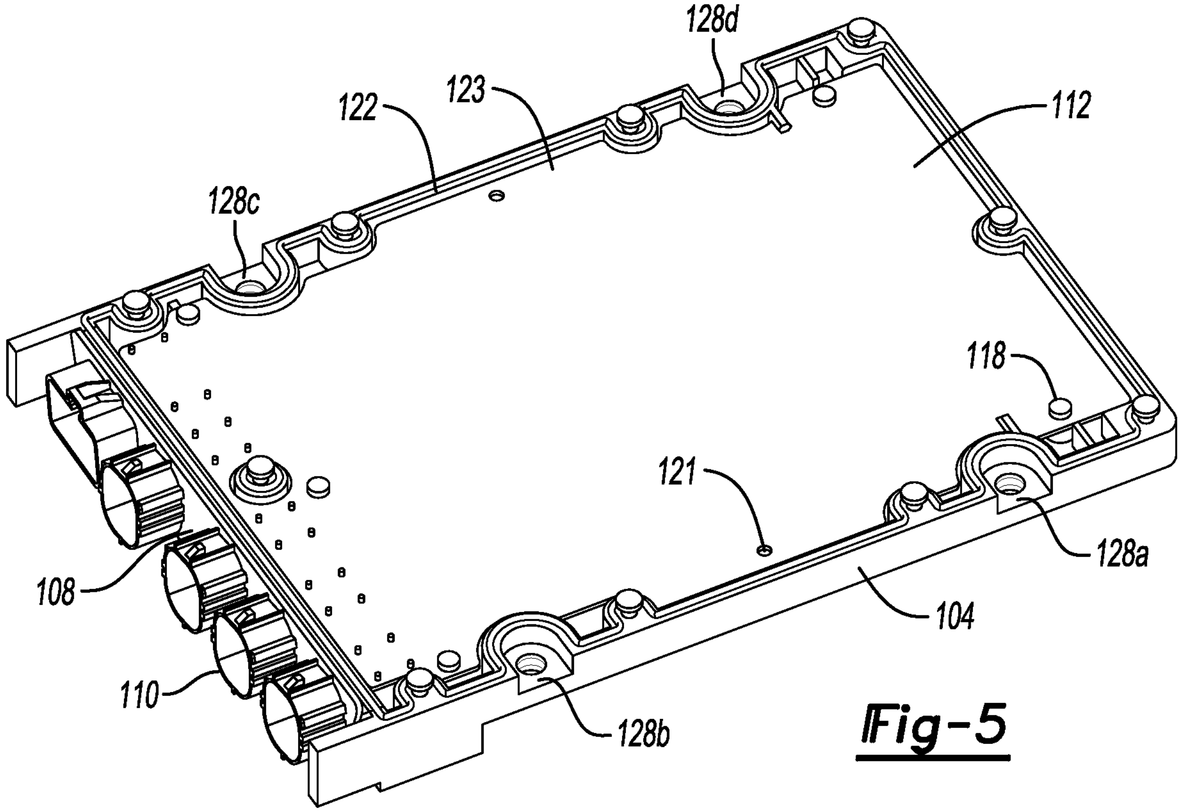
FIG. 5 illustrates the PCB secured to the base of the housing in accordance with an embodiment.

FIG. 5 illustrates the PCB 112 secured to the base 104 of the housing 102 in accordance with an embodiment. The PCB 112 may also be secured to the connector support 108 of the housing 102. The PCB may be secured to the connector support 108 and to the base 104 of the housing 102 via the fasteners 118. The perimeter of the PCB 112 may be adjacent to the first gasket 122 without overlapping the first gasket 122. In one example, the first gasket 122 completely surrounds an outer edge or outer periphery 123 of the PCB 112. The base 104 of the housing 102 may include apertures (128*a*-128*d*) (or "128") that are arranged to receive a fastener (not shown) for fastening or attaching the electronic unit 100 to a panel (not shown), for example, in the vehicle.

Figure 6:
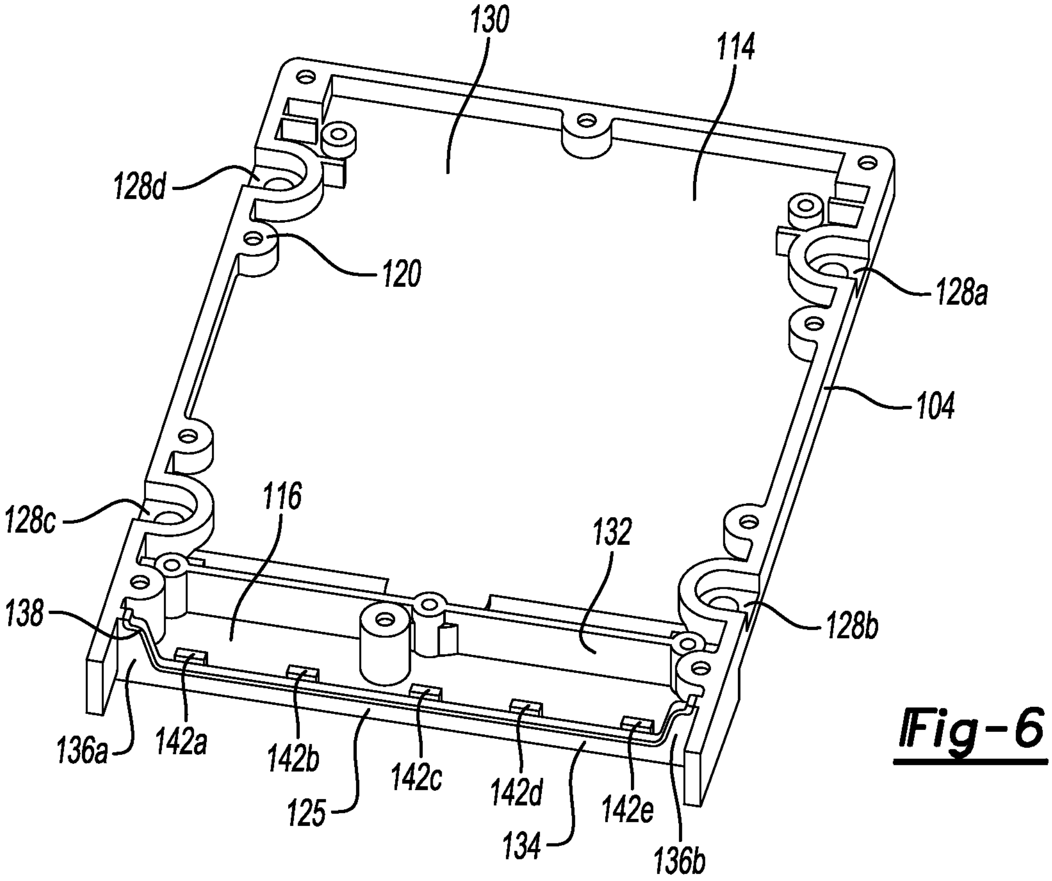
FIG. 6 illustrates a top view of the base of the housing with a second gasket being dispensed onto the base in accordance with an embodiment.

FIG. 6 illustrates a top view of the base 104 of the housing 102 with a second gasket 125 being dispensed onto the base 104. A top surface 130 of the base 104 includes the divider

132 projecting outwardly from the top surface 130 of the base 104 toward the cover (106 not shown). As depicted, the divider 132, along with the perimeter of the base 104, define the first recess 114 and the second recess 116. The outer perimeter 134 of the second recess 116 includes projections 136*a* and 136*b* ("136") extending outwardly from the top surface 130 of the base 104. The second gasket 125 may be dispensed onto the outer perimeter 134 of the second recess 116 and onto the projections. The base 104 of the housing 102 includes projections 142*a-e* ("142") extending outwardly therefrom, and positioned adjacent to the outer perimeter 134 of the second recess 116. Each projection 142 may be laterally positioned and spaced apart from one another. Each projection 142 may be aligned with a corresponding projection 147*a*-147*e* ("147") (e.g., see FIG. 8) on the connector support 108. In one example, the projections 142 may be made from metal.

Figure 7:
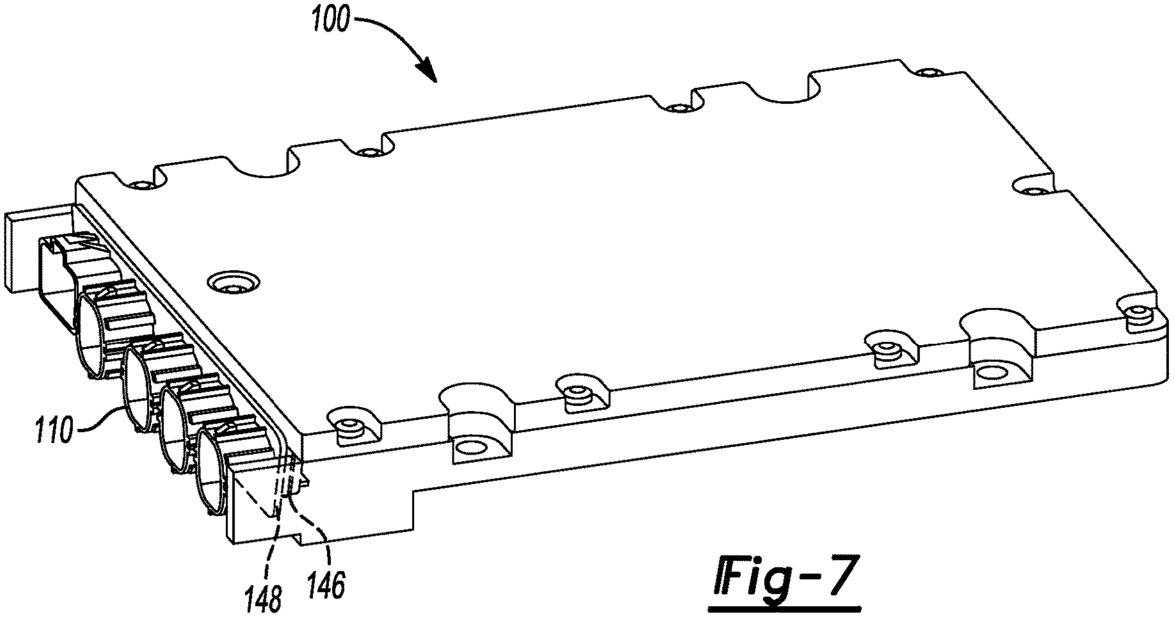
FIG. 7 illustrates a top view of the electronic unit including a connector support with a first rib for promoting the sealing of the connectors in accordance with an embodiment.

FIG. 7 illustrates a top view of the electronics unit 100 including the connector support 108 with a first rib 146 for promoting the sealing of the connectors 110. The first rib 146 may extend outwardly from a bottom surface 148 of the connector support 108 of the housing 102. The first rib 146 may be press fit into the second gasket 125 to increase the effectiveness of the seal. In an example, the first rib 146 may be made of metal. The engagement of the first rib 146 into the second gasket 125 may prevent the passage of fluid into the housing 102.

Figure 8:
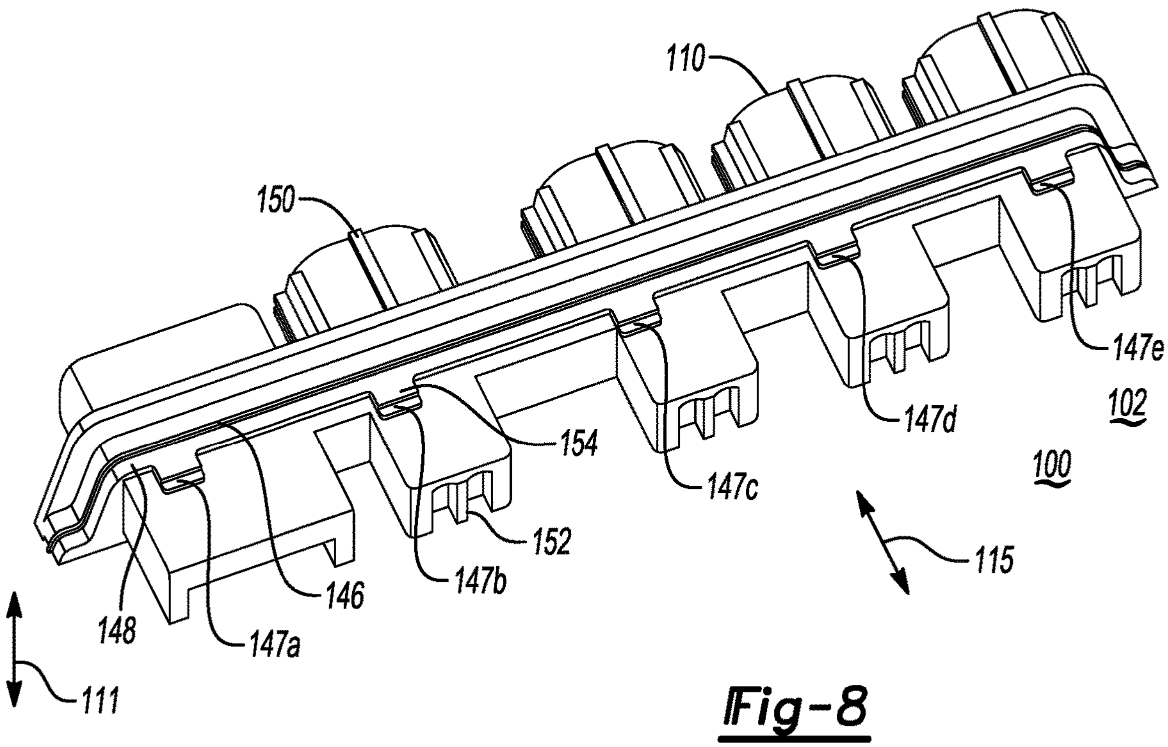
FIG. 8 illustrates a detailed view of the connector support of the housing and the connectors in accordance with an embodiment.

FIG. 8 illustrates a more detailed view of the connector support 108 of the housing 102 and the connectors 110. Each connector 110 includes a head portion 150 and a body portion 152. The first rib 146 may extend outwardly from the bottom surface 148 of the connector support 108 along a first axis 111. The first rib 146 may extend laterally along the bottom surface 148 of the connector support 108. The connector support 108 may include projections 147*a-e* ("147") extending outwardly from the bottom surface 148 of the connector support 108 along a second axis 115. As noted above, in one example, there is a projection 147 aligned with each connector 110 on the connector support 108. Each projection may include a second rib 154*a-e* ("154"). Each of the second ribs 154 may extend outwardly from a bottom surface of each projection 147 along the first axis 111. Each of the second ribs 154 may align with the corresponding projections 142 on the base 104. In an example, the second ribs 154 may be made of metal. Each of the second ribs 154 may bite into or be press fit (or compressively engage) into the corresponding projections 142 on the base 104 of the housing 102. The engagement between the second ribs 154 and the corresponding projections 142 on the base 104 may provide metal to metal contact to promote EMI contact (or ground contact for EMI generated by the electronic unit 100) for the electronics 113 positioned on the PCB 112.

Figure 9:
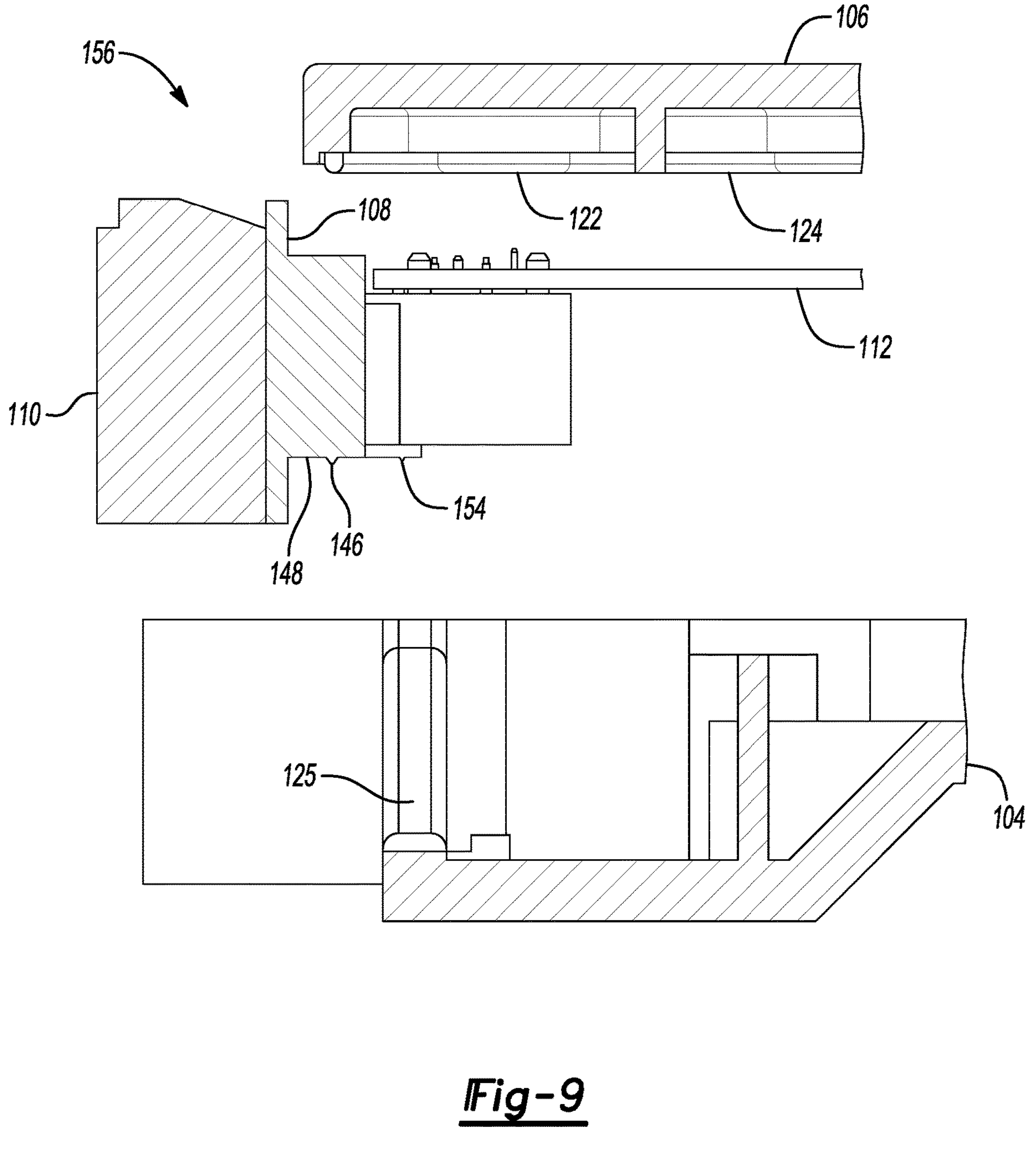
FIG. 9 illustrates the manner which the housing is assembled in accordance with an embodiment.

FIG. 9 illustrates the manner which the housing 102 is assembled. For example, the housing includes the base 104, the cover 106, and the connector assembly 156 in accordance with an embodiment. First, the housing 102 may be formed as three separate parts (the base 104, the cover 106 and the connector assembly 156). In an example, the cover 106 for the housing 102 may be formed using a die cast aluminum or steel. The first gasket 122 may be dispensed onto the bottom surface 124 of the cover 106. In an example, the first gasket 122 may be dispensed onto the bottom surface 124 of the cover 106 using, for example, a CNC machine. The first gasket 122 may be fitted along an interior of the perimeter of the cover 106. In addition to being dispensed along the perimeter of the bottom surface 124 of the cover 106, the first gasket 122 may be dispensed along the perimeter of apertures 120 (not shown) through which fasteners 118 (not shown) may be inserted. The connector assembly 156 may be formed by forming the connector support 108 of the housing 102. The connector support 108 of the housing 102 may be formed using die casting. In an example, the connector support 108 may be formed from die cast aluminum or steel. The connector support 108 may include the connectors 110. The PCB 112 may be secured to the connector support 108 of the housing. The connector support 108 may include the first rib 146. The first rib 146 may extend outwardly from a bottom surface 148 of the connector support 108. The first rib 146 may align with the second gasket 125 on the base 104 of the housing 102. When the connector assembly 156 is assembled onto the base 104, the first rib 146 may press into the second gasket 125 to promote sealing against fluid entering the housing 102. The second rib 154 on each of the projections 147 on the connector support 108 may align with the projections 142 on the base 104. The second rib 154 may press into the projection 142 when the connector assembly 156 is assembled onto the base 104. The first rib 146 may have a height and width that is greater than that of the second rib 154. The first rib 146 and the second ribs 154 may be axially spaced apart from one another and extend along a generally linear axis over the base 106. The base 104 may be formed by using die casting. The second gasket 125 may be dispensed onto the top surface 130 of the base 104.

Figure 10:
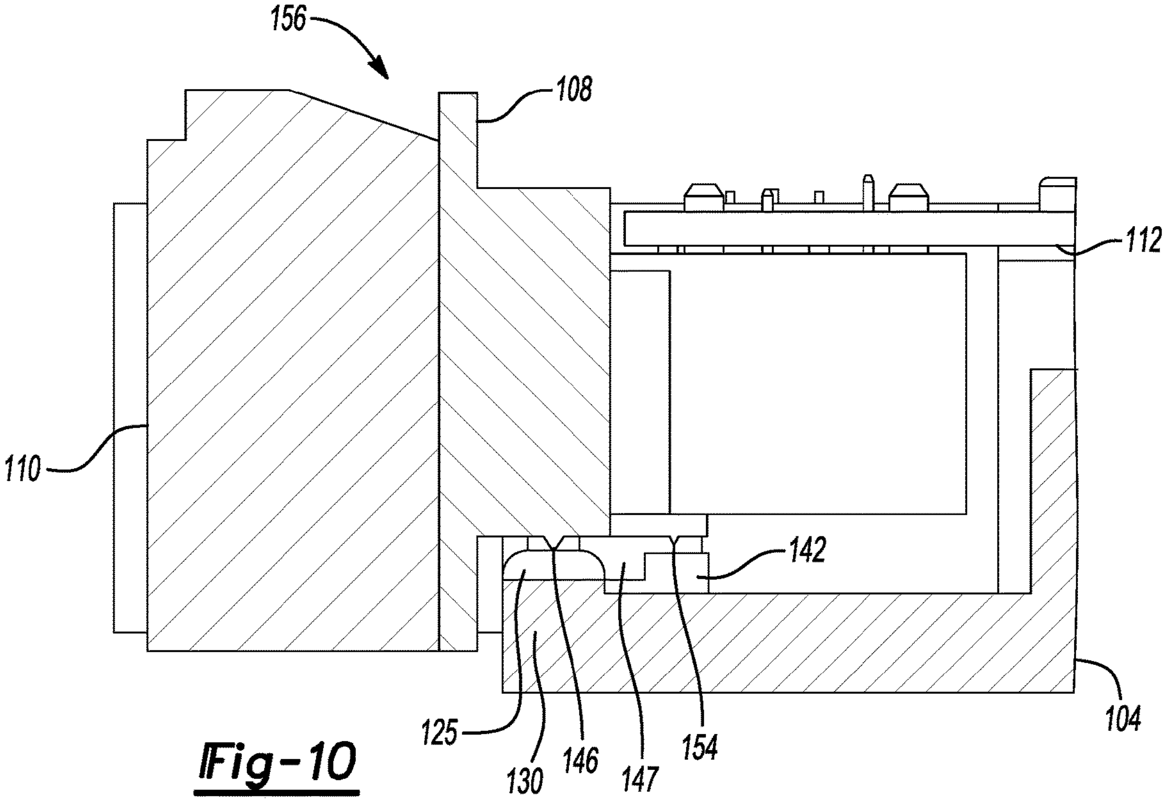
FIG. 10 illustrates another view in which the base, the cover, and a connector assembly are assembled with one another to form the housing in accordance with an embodiment.

FIG. 10 illustrates another view in which the base 104, the cover 106, and the connector assembly 156 are assembled with one another to form the housing 102. As depicted in FIG. 10, the connector assembly 156 may be aligned with the base 104 so that the first rib 146 may be inserted into (or received by) the second gasket 125. Each of the second ribs 154 aligns with the corresponding projection 142 on the base 104 so that each of the second ribs 154 may bite or press into the corresponding projection 142 As depicted in FIG. 10, the connector assembly 156 is aligned with the base 104 but has not yet been pressed into its final position.

Figure 11:
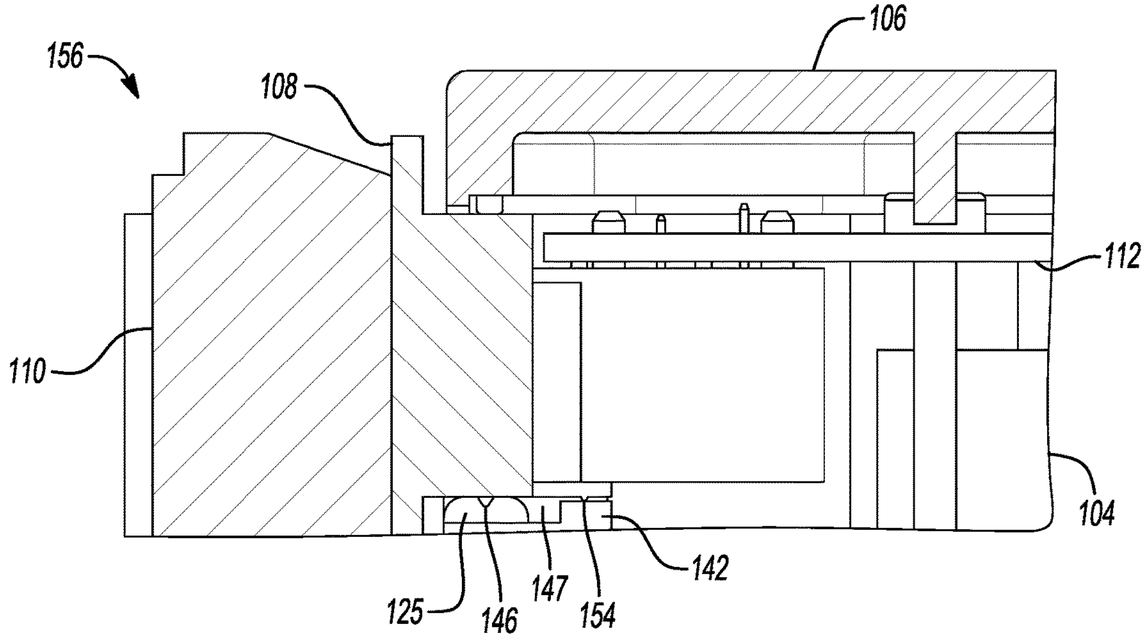
FIG. 11 illustrates another view in which the base, the cover, and the connector assembly are assembled with one another to form the housing in accordance with an embodiment.

FIG. 11 illustrates another view in which the 104, 106, and 156 are assembled with one another to form the housing 102. After the connector assembly 156 is aligned with the base 104, fasteners 118 (not shown) may be delivered to the apertures in the connector assembly 156 and the base 104 and tightened to secure the connector assembly 156 to the base 104. Then, the cover 106 may be aligned with the connector assembly 156 and the base 104. Fasteners 118 (not shown) may then be delivered to the apertures 120 in the cover 106 and tightened to secure the cover 106 to the connector assembly 156 and the base 104. As the fasteners are tightened, the cover 106 and the base 104 are pressed together, sealing the perimeter around the connector assembly 156 and the perimeter around the housing 102. As depicted in the zoomed-in view of the fit between the connector assembly 156 and the base 104 of the housing 102, when the connector assembly 156 is assembled onto the base 104 of the housing 102, the first rib 146 may press into the second gasket 125 so that the second gasket 125 is fitted flush along the bottom surface 148 of the connector support 108. The flush fit provides a fluid seal that prevents fluid from entering the housing around the area of the connectors 110. The second rib 154 may press partially into the corresponding projection 142 so that a recess is left on either side of the second rib 154 between the second rib 154 and the bottom portion of the projection 147. The first rib 146 is pressed into the second gasket 125 to promote sealing against fluid entering the housing. The second rib 154 bites or presses partially into the corresponding projection 142 to create metal to metal contact for promoting EMI contact between the connector assembly 156 and the base of the housing 104. The seal provided by the first gasket 122 may provide robust EMI shielding and also water resistance that may achieve an IPX8 rating. The seal provided by the second gasket 125 and the first 146 rib on the connector support 108 may provide water resistance that may achieve an IPX8 rating. The second rib 154 may create metal to metal contact to promote EMI contact. Together, the first gasket 122, second gasket 125, first rib 146, and second rib 154 of the housing 102 provide an electronics unit 100 that promotes water resistance, EMI shielding, and EMI contact.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electronic unit comprising:

a printed circuit board (PCB);

a plurality of electronics positioned on the PCB;

a housing including a cover and a base that define an opening for receiving the PCB and the plurality of electronics;

the housing including a connector support configured to receive a plurality of connectors, the connector support being positioned between the cover and the base and further being positioned on a side of the housing, the connector support including a first rib extending outwardly therefrom, wherein the connector support includes a plurality of first projections extending outwardly, each first projection including a second rib extending outwardly therefrom, the first rib configured to interact with the housing to prevent liquid from exterior of the housing from penetrating into the opening of the housing and each of the second ribs configured to interact with the base of the housing to provide a conductive path to at least partially remove the electromagnetic interference; and a first gasket encircling an outer periphery of the PCB and being configured to at least partially remove electromagnetic interference generated from the plurality of electronics and to prevent liquid from exterior of the housing from penetrating into the opening of the housing.

2. The apparatus of claim 1, wherein the connector support is positioned between the cover and the base and further is positioned on a side of the housing.

3. The apparatus of claim 2, wherein the base of the housing includes a second gasket positioned on an outer perimeter of the base on the side of the housing.

4. The apparatus of claim 3, wherein the first rib compressively engages the second gasket to prevent the liquid from exterior of the housing from penetrating into the opening of the housing.

5. The apparatus of claim 4, wherein each of the second ribs engages the base of the housing to at least partially remove the electromagnetic interference generated by the plurality of electronics.

6. The apparatus of claim 5, wherein the base of the housing includes a plurality of second projections extending outwardly therefrom to engage each of the second ribs to provide a conductive path to at least partially remove the electromagnetic interference.

7. The apparatus of claim 1, wherein the first gasket is made from a composition of silicone and metal to at least partially remove the electromagnetic interference.

8. The apparatus of claim 1, wherein the first gasket is dispensed in liquid form onto the cover of the housing and cured in place.

9. The apparatus of claim 1, further comprising a second gasket positioned on an outer perimeter of the base on a side of the housing to prevent liquid from exterior of the housing from penetrating into the opening of the housing.

10. The apparatus of claim 9, wherein the first rib extends outwardly from the connector support to compressively engage the second gasket to prevent the liquid from exterior of the housing from penetrating into the opening of the housing.

11. The apparatus of claim 10, wherein the base of the housing includes a plurality of second projections extending outwardly therefrom to engage each of the second ribs to provide a conductive path to at least partially remove the electromagnetic interference.

12. The apparatus of claim 9, wherein the first gasket is made from a composition of silicone and metal to at least partially remove the electromagnetic interference.

13. The apparatus of claim 9, wherein the first gasket is dispensed in liquid form onto the cover of the housing and cured in place.

14. An electronic unit comprising:

a printed circuit board (PCB);

a plurality of electronics positioned on the PCB;

a housing including a cover and a base that define an opening for receiving the PCB and the plurality of electronics; and a connector support to receive a plurality of connectors, the connector support being positioned between the cover and the base and further being positioned on a side of the housing, wherein the connector support includes a first rib extending outwardly therefrom and wherein the connector support includes a plurality of first projections extending outwardly therefrom, each of the plurality of first projections including a second rib extending outwardly therefrom, wherein the cover of the housing includes a first gasket positioned on an outer periphery of the PCB and being configured to at least partially remove electromagnetic interference generated from the plurality of electronics and to prevent liquid from exterior of the housing from penetrating into the opening of the housing, and the base of the housing includes a second gasket positioned on an outer perimeter of the base on the side of the housing, the second gasket being configured to prevent liquid from exterior of the housing from penetrating into the opening of the housing, and wherein the first rib compressively engages the second gasket to prevent liquid from exterior of the housing from penetrating into the opening of the housing and each of the second ribs compressively engage a corresponding second projection extending outwardly from the base of the housing to provide a conductive path to at least partially remove the electromagnetic interference.

15. The apparatus of claim 14, wherein the first rib and the second rib are axially spaced apart from one another and extend along a generally linear axis over the base of the housing, and wherein the height and the width of the first rib are greater than the height and the width of the second rib.

* * * * *